United States Patent
Gotoh et al.

(10) Patent No.: US 7,952,123 B2
(45) Date of Patent: May 31, 2011

(54) THIN FILM TRANSISTOR SUBSTRATE AND DISPLAY DEVICE

(75) Inventors: Hiroshi Gotoh, Kobe (JP); Toshihiro Kugimiya, Kobe (JP); Katsufumi Tomihisa, Kobe (JP)

(73) Assignee: Kobe Steel, Ltd., Kobe-shi (JP)

( * ) Notice: Subject to any disclaimer, the term of this patent is extended or adjusted under 35 U.S.C. 154(b) by 365 days.

(21) Appl. No.: 12/090,883

(22) PCT Filed: Dec. 1, 2006

(86) PCT No.: PCT/JP2006/324106
§ 371 (c)(1),
(2), (4) Date: Apr. 21, 2008

(87) PCT Pub. No.: WO2007/063991
PCT Pub. Date: Jun. 7, 2007

(65) Prior Publication Data
US 2009/0134393 A1    May 28, 2009

(30) Foreign Application Priority Data
Dec. 2, 2005  (JP) .................................. 2005-349378

(51) Int. Cl.
*H01L 29/10* (2006.01)
(52) U.S. Cl. ................. 257/291; 438/149; 257/E29.117
(58) Field of Classification Search .................. 257/291, 257/292, E27.112, E29.117, E29.145, E29.147, 257/E29.151; 438/149
See application file for complete search history.

(56) References Cited

U.S. PATENT DOCUMENTS

| 6,459,464 B1 * | 10/2002 | Nakasima et al. ............. 349/141 |
| 2003/0047812 A1 * | 3/2003 | Hagihara et al. ............... 257/771 |

FOREIGN PATENT DOCUMENTS

| JP | 4 20930 | | 1/1992 |
|----|---------|---|--------|
| JP | 6 235933 | | 8/1994 |
| JP | 06235933 A | * | 8/1994 |
| JP | 7 45555 | | 2/1995 |
| JP | 2001 350159 | | 12/2001 |
| JP | 2002 299630 | | 10/2002 |
| JP | 2002 368202 | | 12/2002 |
| JP | 2002368202 A | * | 12/2002 |
| JP | 2003 73810 | | 3/2003 |
| JP | 2004 214606 | | 7/2004 |
| KR | 1999-0088213 | | 12/1999 |
| WO | 97 13885 | | 4/1997 |

* cited by examiner

*Primary Examiner* — Matthew C Landau
*Assistant Examiner* — Jessica Hall
(74) *Attorney, Agent, or Firm* — Oblon, Spivak, McClelland, Maier & Neustadt, L.L.P.

(57) ABSTRACT

A thin-film transistor substrate in which an aluminum alloy film composing a source/drain wiring is directly connected with a transparent electrode. The thin-film transistor substrate includes a gate wiring, and source wiring and drain wiring, the gate wiring and the source and drain wiring being arranged orthogonally to each other. The single-layer aluminum alloy film composing the gate wiring and the single-layer aluminum alloy film composing the source wiring and the drain wiring are the same in composition. Furthermore, display devices can be mounted with the above thin-film transistor substrates.

7 Claims, 4 Drawing Sheets

THIN FILM TRANSISTOR SUBSTRATE AND DISPLAY DEVICE

TECHNICAL FIELD

This invention relates to thin-film transistor substrates and display devices using such substrates and, in particular, to those newly developed thin-film transistor substrates and display devices which are used in active matrix type flat-panel displays, reflective film, and optical components such as semiconductors and liquid crystal displays.

BACKGROUND ART

Figure 1:
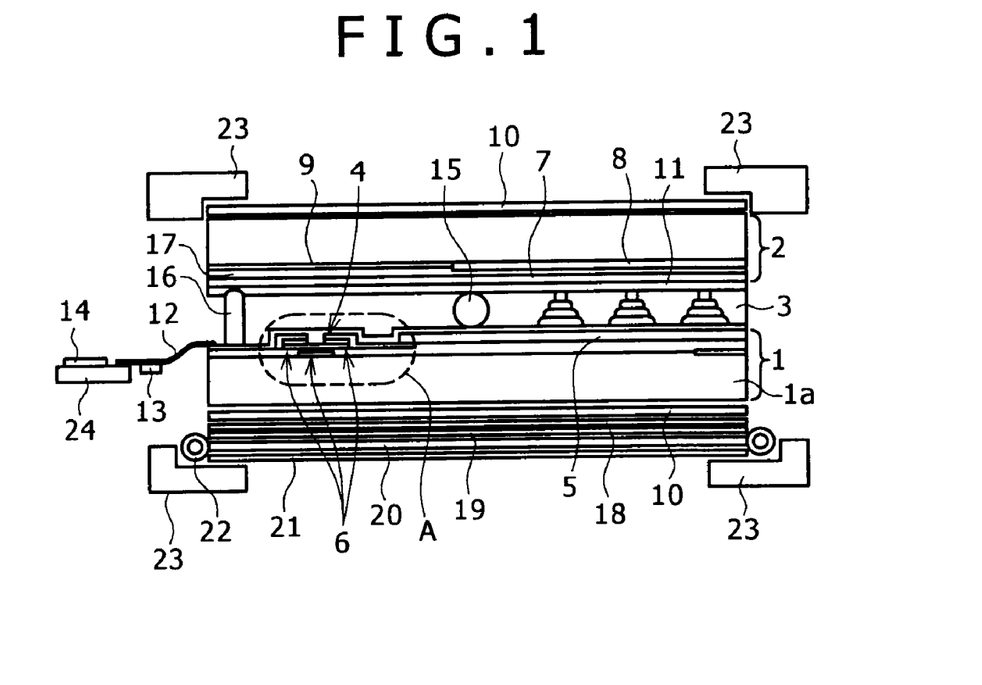
[FIG. 1] is an explanatory drawing of schematic enlarged sectional view illustrating the structure of the liquid crystal display substrate and the liquid crystal display device to which the TFT substrate according to the present application is applied.

For example, as shown in FIG. 1, the active matrix type liquid crystal display device uses the thin-film transistor (TFT) 4 as a switching element, and is composed of firstly TFT substrate (TFT array substrate) 1 attached with transparent electrodes (picture electrodes) 5 and a wiring section 6 covering gate wiring and source/drain wiring, secondly opposing substrate 2 attached with common electrodes 7 and placed with a predetermined distance apart from and on the opposite side of the abovementioned TFT substrate 1, and thirdly a liquid crystal layer 3 filled between the TFT substrate 1 and the opposing substrate 2.

As for the above transparent electrodes 5, for example, ITO film of indium oxide ($In_2O_3$) containing tin oxide (SnO) at approximately 10% by mass, or IZO film of indium oxide ($In_2O_3$) containing zinc oxide (ZnO) at approximately 10% by mass is used.

Figure 2:
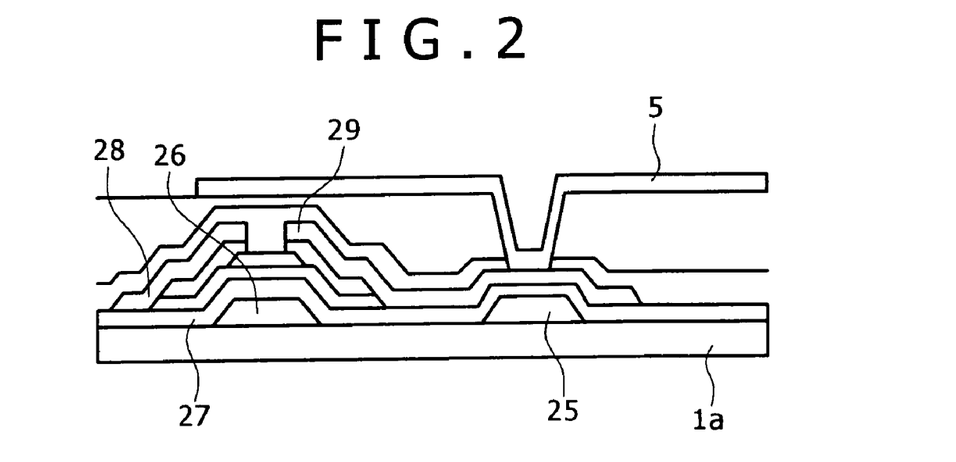
[FIG. 2] is a schematic enlarged view of the ambits A in the above FIG. 1.

FIG. 2 illustrates an enlargement of the ambits A in FIG. 1 in which the wiring section 6 electrically connecting to the transparent electrode 5 is included. For the gate wiring 26 in FIG. 2, a wiring structure made up with single-layer film of Mo or Cr or aluminum alloy film such as Al—Nd laminated with high melting point metals [molybdenum (Mo), chrome (Cr), titan (Ti), tungsten (W), etc.] has been adopted in the past. For the source wiring 28 or the drain wiring 29 (these wirings 28 and 29 are to be collectively referred to as "source/drain wiring" hereinafter), it has been also practiced conventionally to use a laminated wiring structure of single-layer pure aluminum (Al) combined with the above-mentioned high melting point metals. (See the patent documents 1, 2 and 3, for example.)

The reason why the above high melting point metals are used in lamination is as follows. If the above transparent electrode (ITO film) 5 is directly connected with the pure aluminum film or the Al—Nd or other aluminum alloy film composing the source/drain wiring, oxidization of aluminum may produce highly resistive aluminum oxide in the contact interface between the transparent electrode and the above pure aluminum film or Al—Nd or other aluminum alloy films, causing increase in contact resistance between the signal wire and the transparent electrode 5 leading to deterioration in display quality on the screen.

The above reason is also affirmed by the following facts. Aluminum is an easily oxidizable element for which aluminum oxide covering is easily formed in the atmosphere. Particularly, the oxygen used for making film of the transparent electrode 5 composed of metallic oxide or generated during the film-making process has a promotive effect on formation of the abovementioned highly resistive aluminum oxide covering.

To solve the aforesaid problem, barrier metals (high melting point metals) have been used as materials for lamination in the past, since they have been believed to have a good effect on preventing oxidization from taking place in the surface of the aluminum alloy wiring (alloy film) and enhancing desirable state of contact between the aluminum alloy wiring (alloy film) and the transparent electrode.

To build up the structure in which barrier metals are interventional, it would be needed to add a process of forming the barrier metals. Also the sputtering apparatus used for deposition of the gate wiring and the source/drain wiring would require an additional deposition chamber for the barrier metals. However, as higher-volume production enables cost reduction to advance for liquid crystal displays, etc., a new problem has emerged in that the above formation of barrier metals has been bringing about increase in manufacturing cost and aggravating productivity. The tendency in recent years is to require the kind of electrode materials and related manufacturing processes that can do without the barrier metals. In this connection, the inventors of the present invention have already proposed a plan aiming at simplifying the above process for formation of barrier metals and, instead, adopting an aluminum alloy film for wiring that can allow the transparent electrode to be connected to the wiring section directly. (See the patent document 4.)

Incidentally, the forming temperature for the gate dielectric film 27 formed following the gate wiring 26 is the highest among the processes for array forming of the thin-film transistors, and the above gate wiring 26 is subject to a thermal history of high temperature. Therefore, this gate wiring 26 is required to have a better heat resistance property than the source/drain wiring 28 & 29 which is formed in the back-end process. For this reason, aluminum alloys or the above high melting point metals, which possess higher heat resistance property than is required for the source/drain wiring 28 & 29, have often been used for the gate wiring 26. (See the patent document 5.)

Although a superb heat resistance property can be secured for the aluminum alloy with a large alloy content or the above high melting point metals, these materials still leave some other problems such as high electrical resistivity inherent in these wiring materials.

Figure 3:
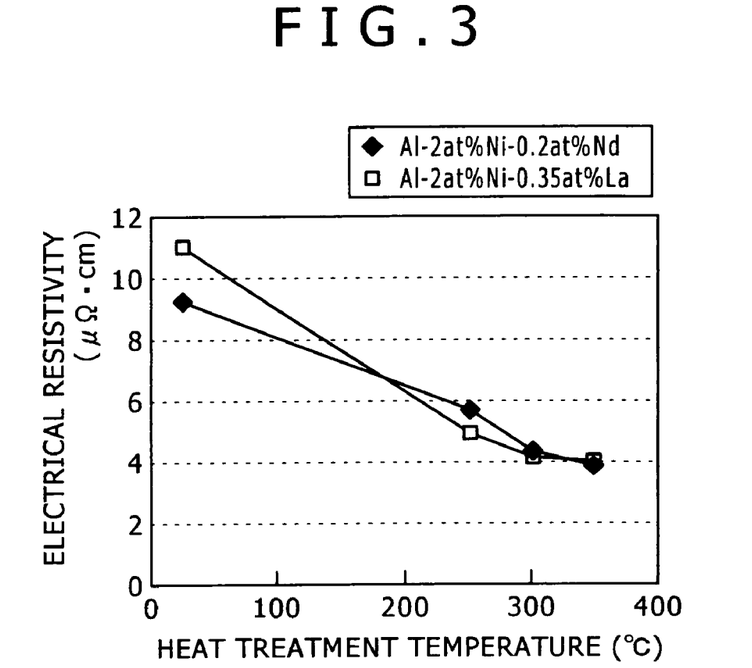
[FIG. 3] is a graph showing the relationship between the temperatures (heat treatment temperatures) applied to the aluminum alloy film and the electrical resistivity.

FIG. 3 shows the relationship between temperature (heat treatment temperature) applied to the aluminum alloy film and electrical resistivity. As shown in this FIG. 3, electrical resistivity is dependent on temperature; that is, the higher the temperature is, the lower the electrical resistivity will be. This is because, if the substrate is heated during making of the film, the alloy content is separated from the aluminum alloy film at a low temperature and, at the same time, recrystallization of aluminum progresses.

Even if alloy content is increased for more resistance to higher temperature in using an aluminum alloy film composing the gate wiring 26 which is subject to high temperature, the electrical resistivity decreases, as shown in the above FIG. 3, under the high-temperature state during formation of the gate dielectric film 27. However, if the above aluminum alloys or high melting point metals are adopted for the source/drain wiring 28 & 29 which is not subject to high temperature, electrical resistance cannot be reduced. Materials for the above source/drain wiring 28 & 29 have thus been studied about centering on the materials for which priority is given to electrical resistivity than to heat resistance.

When using different materials for the gate wiring and for the source/drain wiring respectively, however, it would become necessary to prepare plural kinds of wiring materials and complex apparatuses, which situation would not be appropriate for complying with the need for more efficient quantity production of, for example, liquid crystal displays, etc. Desired here, therefore, is realization of a thin-film transistor substrate for which still more simplified manufacturing process will do.

[Patent Document 1]
Japanese Patent Application Laid-open Publication No. 4-20930-A

[Patent Document 2]
Japanese Patent Application Laid-open Publication No. 6-12503-A

[Patent Document 3]
Japanese Patent Application Laid-open Publication No. 2001-350159-A

[Patent Document 4]
Japanese Patent Application Laid-open Publication No. 2004-214606-A

[Patent Document 5]
Japanese Patent Application Laid-open Publication No. 7-45555-A

DISCLOSURE OF THE INVENTION

Problem to be Solved by the Invention

The present invention has been made in view of the foregoing circumstances. The object of the invention is to provide the thin-film transistor substrate and the display devices mounted with the aforementioned thin-film transistor substrate, wherein the aluminum alloy film composing the source/drain wiring is connected directly to the transparent electrode, and both the source/drain wiring and the gate wiring have good characteristics; and yet the manufacture can be carried out by considerably simplified process.

Means for Solving the Problem

The thin-film transistor substrate relating to the present invention is one that has the gate wiring, and the source wiring plus the drain wiring, the former one being arranged orthogonally to the latter two. This thin-film transistor substrate is characterized in that the single-layer aluminum alloy film composing the gate wiring has the same composition as the single-layer aluminum alloy film composing the source wiring plus the drain wiring.

The preferred mode of the above thin-film transistor substrate is that the above single-layer thin-film transistor substrate has alloy content containing: at least one component to be selected from a group consisting of "X" (X=Ni, Ag, Zn, Cu, Ge) at a rate of 0.1 to 6 atomic percent (atomic percent may be referred to as "at %" hereinafter), additionally, one or more components to be selected from a group consisting of "$Y_1$" ($Y_1$=Nd, Y, Fe, Co) at a rate within the range calculated on the formula (1) shown below, and the rest being aluminum and unavoidable impurities.

Formula: $0.1 \leq (CX + 10 CY_1) \leq 6$ (1)

[Where: CX=Amount of content of "X" in aluminum alloy (unit: at %)
$CY_1$=Amount of content of "$Y_1$" in aluminum alloy (unit: at %)]

Another preferred mode of the thin-film transistor substrate is that the above single-layer thin-film transistor substrate has alloy content containing: at least one component to be selected from a group consisting of "X" (X=Ni, Ag, Zn, Cu, Ge) at a rate of 0.1 to 6 at % (=atomic percent), additionally, one or more components to be selected from a group consisting of "$Y_2$" ($Y_2$=Ti, V, Zr, Nb, Mo, Hf, Ta, W) at a rate within the range calculated on the formula (2) shown below, and the rest being aluminum and unavoidable impurities.

Formula: $0.1 \leq (CX + 15 CY_2) \leq 6$ (2)

[Where: CX=Amount of content "X" in aluminum alloy (unit: at %)
$CY_2$=Amount of content "$Y_2$" in aluminum alloy (unit: at %)]

Yet another preferred mode of the above thin-film transistor substrate is that the above single-layer thin-film transistor substrate has alloy content containing: at least one component to be selected from a group consisting of "X" (X=Ni, Ag, Zn, Cu, Ge) at a rate of 0.1 to 6 at % (=atomic percent), additionally, one or more components to be selected from a group consisting of "$Y_3$" ($Y_3$=Cr, Mn, Ru, Rh, Pd, Ir, Pt, La, Gd, Tb, Dy, Sm, Eu, Ho, Er, Tm, Yb, Lu) at a rate within the range calculated on the formula (3) shown below, and the rest being aluminum and unavoidable impurities.

Formula: $0.1 \leq (CX + 5 CY_3) \leq 6$ (3)

[Where: CX=Amount of content "X" in aluminum alloy (unit: at %)
$CY_3$=Amount of content "$Y_3$" in aluminum alloy (unit: at %)]

Yet another preferred mode of the above thin-film transistor substrate is that the above single-layer thin-film transistor substrate has alloy content containing: at least one component to be selected from a group consisting of "X" (X=Ni, Ag, Zn, Cu, Ge) at a rate of 0.1 to 6 at % (=atomic percent), one additional component Mg at a rate within the range calculated on the formula (4) shown below, and the rest being aluminum and unavoidable impurities.

Formula: $1 \leq (CX + 2 CMg) \leq 6$ (4)

[Where: CX=Amount of content "X" in aluminum alloy (unit: at %)
CMg=Amount of content Mg in aluminum alloy (unit: at %)]

It is preferable that the above single-layer aluminum alloy film should have alloy content containing Ni or Ge at a rate of 1 or more at %. Also, the present invention includes relative display devices mounted with the above thin-film transistor substrate.

The "single-layer aluminum alloy film" as is proposed in the present invention refers to the structure made of aluminum alloy film only, not including a laminated layer of barrier metals consisting of high melting point metals in which Mo, Cr, Ti, and W are the major components. When it is said that the single-layer aluminum alloy film composing the gate wiring has "the same composition" as the single-layer aluminum alloy film composing the source wiring plus the drain wiring, it means that in the comparison of compositions between the aluminum alloy film composing the source/drain wiring and the aluminum alloy film composing the gate wiring, the contained amounts (at %) of the second component, and also of the third component if such third component is included, coincide with each other in the first effective digit while remaining within an allowable range in the second effective digit or below.

According to the present invention, it is possible to use the same single-layer aluminum alloy wiring of the same composition for both the source/drain wiring and the gate wiring based on the structure where the aluminum alloy film composing the source/drain wiring is directly connected to the transparent electrode. Consequently, it becomes possible to make the materials commonly usable for forming both the above gate wiring and source/drain wiring, thus permitting it to manufacture the thin-film transistors and the display devices mounted with such transistors by significantly simplified process.

| EXPLANATIONS OF NUMERALS | |
|---|---|
| 1 | TFT substrate (TFT array substrate) |
| 1a | Glass substrate |
| 2 | Opposing substrate (opposing electrode) |
| 3 | Liquid crystal layer |
| 4 | Thin-film transistor (TFT) |
| 5 | Transparent electrode (picture electrode ITO film) |
| 6 | Wiring section |
| 7 | Common electrode |
| 8 | Color filter |
| 9 | Light shielding film |
| 10 | Polarization plate |
| 11 | Light distribution film |
| 12 | TAB tape |
| 13 | Driver circuit |
| 14 | Control circuit |
| 15 | Spacer |
| 16 | Sealing material |
| 17 | Passivation film |
| 18 | Diffusion plate |
| 19 | Prism sheet |
| 20 | Light guide plate |
| 21 | Reflecting plate |
| 22 | Backlight |
| 23 | Holding frame |
| 24 | Printed-circuit board |
| 25 | Scanning line |
| 26 | Gate wiring |

| EXPLANATIONS OF NUMERALS -continued | |
|---|---|
| 27 | Gate dielectric film |
| 28 | Source wiring |
| 29 | Drain wiring |
| 30 | Passivation film (silicon nitride film) |
| 31 | Photoresist |
| 32 | Contact hole |

BEST MODE FOR CARRYING OUT THE INVENTION

The inventors of the present invention have been devoted to study with a view to producing a thin-film transistor substrate (which may be called as "TFT" hereinafter) having a structure in which a single-layer aluminum alloy film composing the source/drain wiring keeps direct contact with the transparent electrode, together with a display device mounted with the above TFT, by a significantly simplified process, while maintaining such good characteristics as the high display quality as achieved by the liquid crystal display or the like.

To begin with, the inventors of the present invention have made a renewed study on the current manufacturing conditions in relation to the production process of the thin-film transistors as well as the required characteristics of the single-layer aluminum alloy film composing the above gate wiring and source/drain wiring. When forming the gate dielectric film above the gate wiring in the above production process, it is necessary to set the film-forming temperature at 300-350° C. in order to obtain a film quality that can ensure the operating characteristics required for the thin-film transistor. This means that the single-layer aluminum alloy film composing the gate wiring requires such characteristics as heat resistance enough to withstand 350° C. along with electrical resistivity sufficiently reducible at the same temperature.

In the case of the above source/drain wiring, the passivation film is to be formed as the layer immediately above the source/drain wiring after this wiring has been formed, and the temperature applied to the film formation shows a tendency of becoming lower owing to advancement of film-forming technique. For instance, the SiN film, a commonly used passivation film, can yield a sufficiently good quality when formed at a film-forming temperature of 250° C. Therefore, there is no problem if it is certain that the single-layer aluminum alloy film composing the source/drain wiring has a heat resistance to 250° C.; instead, the film is required to have another important characteristic that its electrical resistivity should be kept sufficiently low with heating applied at 250° C.

In this connection, the inventors of the present invention have decided to adopt, as the material for the single-layer aluminum alloy film composing the gate wiring and source/drain wiring, an aluminum alloy that has heat resistance and electrical resistivity good enough to withstand the high temperature process in manufacturing the thin-film transistor. Such decision has made it possible to use common materials for the single-layer aluminum alloy film composing both the gate wiring and source/drain wiring and simplify the manufacturing process of the TFT substrate considerably while maintaining the high grade of display quality of liquid crystal displays, etc.

The thin-film transistor substrate in the present invention may well use the same material of the same composition for both of the single-layer aluminum alloy film composing the above gate wiring and the single-layer aluminum alloy film composing the above source/drain wiring, though it is not intended here to specify the composition of the single-layer aluminum alloy film precisely. However, an easy way to find out the single-layer aluminum alloy film having the heat resistance and electrical resistivity suitable for both the gate wiring and the source/drain wiring will be to follow the preferred composition shown below.

That is, the above single-layer aluminum alloy film is preferred, first of all, to contain at least one component (hereinafter may be referred to as the "element X" or simply as "X") to be selected from a group consisting of "X" (X=Ni, Ag, Zn, Cu, Ge) at a rate of 0.1-6 at %.

The above element X is a component effective at reducing contact resistance caused when direct contact is made with the transparent electrode. For example, in order to realize low contact resistance (contact resistance of 200Ω or below in 10 μm square contact hole) thereby to maintain the high grade of display quality of liquid crystal display, contained amount of the above element X should be preferably 0.1 at % or more. On the other hand, to make the aluminum alloy film show electrical resistance of 7 μΩ·cm or below after heat treatment at 250° C. for 30 minutes, contained amount of the above element X should be preferably 6 at % or below. Particularly, the above element X including Ni or Ge at 0.1 at % or more is preferred as it shows low contact resistance; the element X including Ni is especially preferable because it shows still more excellent heat resistance.

The above single-layer aluminum film including a specified amount of the above element X and further including the following element(s) as the third element, with the remaining portion being aluminum and unavoidable impurities, is more preferable, since it can easily realize heat resistance, low electrical resistivity, and low contact resistance of the required levels respectively. The above-mentioned impurities may include oxygen, nitrogen, carbon, argon, etc., which total is 0.1 at % or below.

Preferable as the above third element is one or more components (which hereinafter may be referred to as the "element $Y_1$" or simply as "$Y_1$") to be selected from a group consisting of "$Y_1$" ($Y_1$=Nd, Y, Fe, Co) and contained at a rate within the range calculated on the formula (1) shown below.

$$\text{Formula: } 0.1 \leq (CX+10CY_1) \leq 6 \quad (1)$$

[Where: CX=Amount of content of "X" in aluminum alloy (unit: at %)
$CY_1$=Amount of content of "$Y_1$" in aluminum alloy (unit: at %)]

To obtain necessary heat resistance for the gate wiring, it is preferable that the aluminum alloy should contain the above element $Y_1$ at a rate to be set so that the formula of (CX+10 $CY_1$) may take a value of 0.1 at % or over; where CX is an amount of X contained in aluminum alloy (unit: at %), and $CY_1$ is an amount of $Y_1$ contained in aluminum alloy (unit: at %).

On the other hand, if the contained amount of the above element $Y_1$ is excessive, electrical resistivity cannot be lowered sufficiently at 250° C. (the heat treatment temperature of the source/drain wiring). In order to make the aluminum alloy film exhibit an electrical resistivity of 7 μΩ·cm or below in case the film is given a vacuum heat treatment at 250° C. for 30 minutes, the above element $Y_1$ should be set and contained at a proper value so that the above formula of (CX+10 $CY_1$) may take a value of 6 at % or below.

Preferable as another third element is one or more components (which hereinafter may be referred to as the "element $Y_2$" or simply as "$Y_2$") to be selected from a group consisting of "$Y_2$" ($Y_2$=Ti, V, Zr, Nb, Mo, Hf, Ta, W) and contained at a rate within the range calculated on the formula (2) shown below.

$$\text{Formula: } 0.1 \leq (CX+15CY_2) \leq 6 \quad (2)$$

[Where: CX=Amount of content "X" in aluminum alloy (unit: at %)
$CY_2$=Amount of content "$Y_2$" in aluminum alloy (unit: at %)]

To obtain necessary heat resistance for the gate wiring, it is preferable that the aluminum alloy should contain the above element $Y_2$ at a rate to be set so that the formula of (CX+15 $CY_2$) may take a value of 0.1 at % or over; where CX is an amount of X contained in aluminum alloy (unit: at %), and $CY_2$ is an amount of $Y_2$ contained in aluminum alloy (unit: at %).

On the other hand, if the contained amount of the above element $Y_2$ is excessive, electrical resistivity cannot be lowered sufficiently at 250° C. (the heat processing temperature of the source/drain wiring). In order to make the aluminum alloy film exhibit an electrical resistivity of 7 μΩ·cm or below in case the film is given a vacuum heat treatment at 250° C. for 30 minutes, the above element $Y_2$ should be set and contained so that the above formula of (CX+10 $CY_2$) may take a value of 6 at % or below.

Preferable as yet another third element is one or more components (which hereinafter may be referred to as the "element $Y_3$" or simply as "$Y_3$") to be selected from a group consisting of "$Y_3$" ($Y_3$=Cr, Mn, Ru, Rh, Pd, Ir, Pt, La, Gd, Tb, Dy, Sm, Eu, Ho, Er, Tm, Yb, Lu) and contained at a rate within the range calculated on the formula (3) shown below.

$$\text{Formula: } 0.1 \leq (CX+5CY_3) \leq 6 \quad (3)$$

[Where: CX=Amount of content "X" in aluminum alloy (unit: at %)
$CY_3$=Amount of content "$Y_3$" in aluminum alloy (unit: at %)]

To obtain necessary heat resistance for the gate wiring, it is preferable that the aluminum alloy should contain the above element $Y_3$ at a rate to be set so that the formula of (CX+5 $CY_3$) may take a value of 0.1 at % or over, where CX is an amount of X contained in aluminum alloy (unit: at %), and $CY_3$ is an amount of $Y_3$ contained in aluminum alloy (unit: at %).

On the other hand, if the contained amount of the above element $Y_3$ is excessive, electrical resistivity cannot be lowered sufficiently at 250° C. (the heat treatment temperature of the source/drain wiring). In order to make the aluminum alloy film exhibit an electrical resistivity of 7 μΩ·cm or below in case the film is given a vacuum heat treatment at 250° C. for 30 minutes, the above element $Y_3$ should be set and contained at a proper value so that the above formula of (CX+5 $CY_3$) may take a value of 6 at % or below.

Preferable as yet another third element is Mg to be contained at a rate within the range calculated on the formula (4) shown below.

$$\text{Formula: } 0.1 \leq (CX+2CMg) \leq 6 \quad (4)$$

[Where: CX=Amount of content "X" in aluminum alloy (unit: at %)
CMg=Amount of content "Mg" in aluminum alloy (unit: at %)]

To obtain necessary heat resistance for the gate wiring, it is preferable that the aluminum alloy should contain the above Mg at a rate to be set so that the formula of (CX+2CMg) may take a value of 0.1 at % or over, where CX is an amount of X contained in aluminum alloy (unit: at %), and CMg is an amount of Mg contained in aluminum alloy (unit: at %).

On the other hand, if the contained amount of the above Mg is excessive, electrical resistivity cannot be lowered sufficiently at 250° C. (the heat treatment temperature of the source/drain wiring). In order to make the aluminum alloy film exhibit an electrical resistivity of 7 μΩ·cm or below in case the film is given a vacuum heat treatment at 250° C. for 30 minutes, the above element Mg should be set and contained at a proper value so that the formula of (CX+2 CMg) may take a value of 6 at % or below.

As the aluminum alloy film of three-component system, the alloy film containing the element X at 0.1 at % or over along with the above-mentioned third element ($Y_1, Y_2, Y_3$, or Mg) is preferable, as it is excellent in point of heat resistance, low electrical resistivity, and low contact resistance.

Concrete examples of the above aluminum alloy film of three-component system may be quoted as those composed of Al—Ni—Nd or Al—Ni—La. For example, those single-layer aluminum alloy films having such compositions as (Al—2 at % Ni—0.2 at % Nd) and (Al—2 at % Ni—0.35 at % La) can control incidence rate for hillocks and voids well below the given specification level of $1 \times 10^9$ spots/m$^2$ after 30 minutes of vacuum heat treatment at 350° C.

Also, the electrical resistivity of the above single-layer aluminum alloy films measured after heat treatment at 350° C. (the measuring method is the same as applied to the examples explained afterward) is as follows.

Al—2 at % Ni—0.2 at % Nd . . . 3.8 μΩ·cm
Al—2 at % Ni—0.35 at % La . . . 4.0 μΩ·cm

These figures of resistivity are rather on the smaller side in comparison with the example of Al—2 at % Nd (4.2 μΩ·cm).

It is a matter of course but the incidence rate for hillocks and voids is few to none after 30 minutes of vacuum heat treatment at 250° C. Also, the electrical resistivity measured after the above heat treatment is as follows.

Al—2 at % Ni—0.2 at % Nd . . . 5.7 μΩ·cm
Al—2 at % Ni—0.35 at % La . . . 4.9 μΩ·cm

In comparison with the case of Al—2 at % Nd (11.5 μΩ·cm), these figures are sufficiently smaller. These results prove that the aluminum alloy films exemplified above are suitable for common materials to compose both the gate wiring and the source/drain wiring.

In the next place, explanation is made on the drawings, FIGS. 4 to 11, illustrating the outline of the manufacturing process of the TFT substrate (TFT array substrate) in the present invention. This invention, however, does not intend as far as to be specific about the manufacturing method for the TFT substrate mounted with the above gate wiring and the source/drain wiring. Incidentally, the explanation below is introducing amorphous silicon TFT utilizing hydrogenated amorphous silicon for semiconductor layer as an example of thin-film transistor to be formed to serve as a switching element. Further, as a single-layer aluminum alloy film to compose the gate wiring and the source/drain wiring, the case of forming Al—Ni—La alloy film is explained with illustration, but without being limited to.

Figure 4:
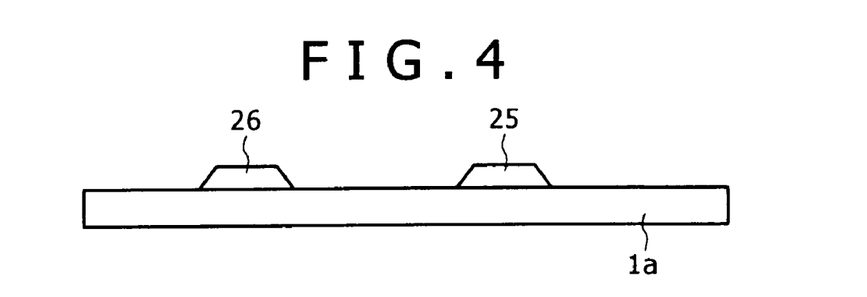
[FIG. 4] is an explanatory drawing showing an example of the step-by-step manufacturing process of the TFT substrate shown in the above FIG. 2.

First, Al—Ni—La alloy film in the thickness of 200 nm is formed on the glass substrate 1a by sputtering, and on this Al—Ni—La alloy film, the gate wiring 26 is to be formed by patterning as shown in FIG. 4. At the same time, the Al—Ni—La alloy film is to be processed for etching in a tapered shape of 30-700 so that the gate dielectric film may have a good coverage.

Figure 5:
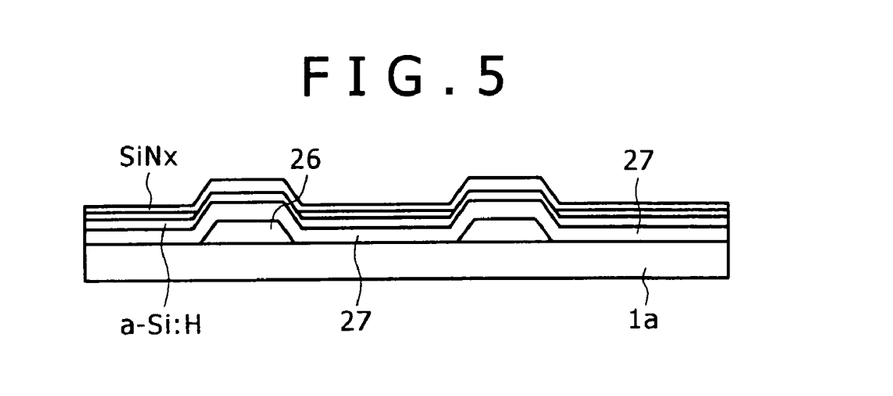
[FIG. 5] is an explanatory drawing showing an example of the step-by-step manufacturing process of the TFT substrate shown in the above FIG. 2.

Next, as shown in FIG. 5, silicon nitride film (SiNX) in a thickness of 300 nm is to be formed as the gate dielectric film 27 at a film-forming temperature of 350° C. by the plasma CVD method. And 50 nm thick hydrogenated amorphous silicon film (a-Si:H) and 300 nm silicon nitride film (SiNX) are to be formed at 320° C.

Figure 6:
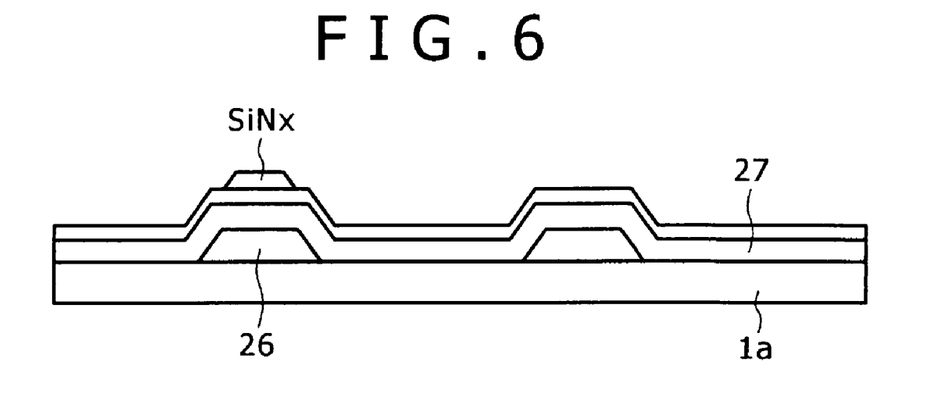
[FIG. 6] is an explanatory drawing showing an example of the step-by-step manufacturing process of the TFT substrate shown in the above FIG. 2.
Figure 7:
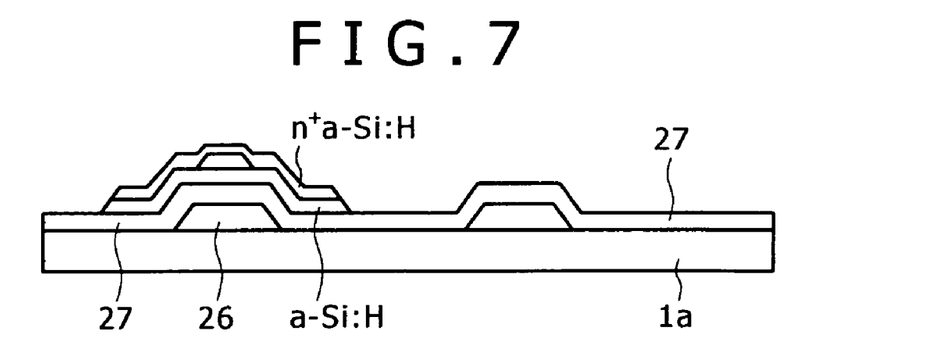
[FIG. 7] is an explanatory drawing showing an example of the step-by-step manufacturing process of the TFT substrate shown in the above FIG. 2.

Succeedingly, as shown in FIG. 6, patterning is made of the above silicon nitride film by back exposure using the gate wiring as a mask, to create a channel passivation film. Further, as shown in FIG. 7, a phosphor-doped 50 nm-thick n$^+$-type hydrogenated amorphous silicon film (n$^+$ a-Si:H) is formed at 320° C., and patterning is made of a hydrogenated amorphous silicon film and an n$^+$-type hydrogenated amorphous silicon film.

Figure 8:
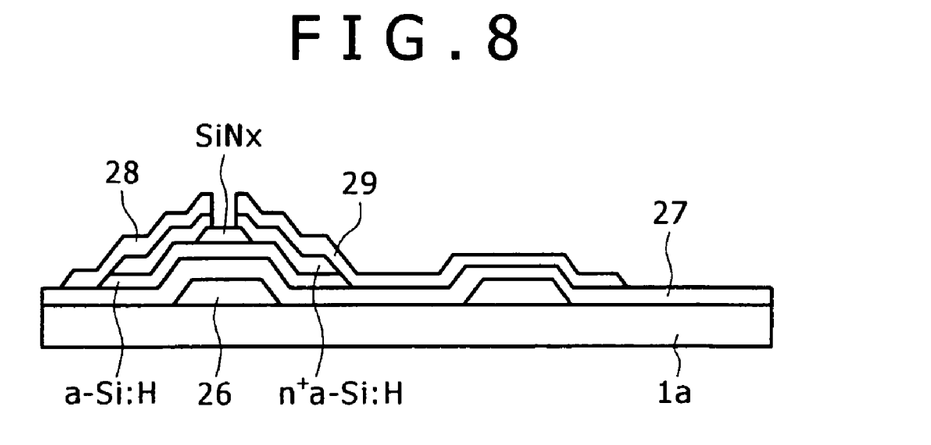
[FIG. 8] is an explanatory drawing showing an example of the step-by-step manufacturing process of the TFT substrate shown in the above FIG. 2.

As FIG. 8 shows, a 300 nm-thick Al—Ni—La alloy film is formed, and the source/drain wiring 28 & 29 is formed by patterning. Besides, the source/drain wiring 28 & 29 is used as a mask to remove the n$^+$-type hydrogenated amorphous silicon film on the channel passivation film.

Figure 9:
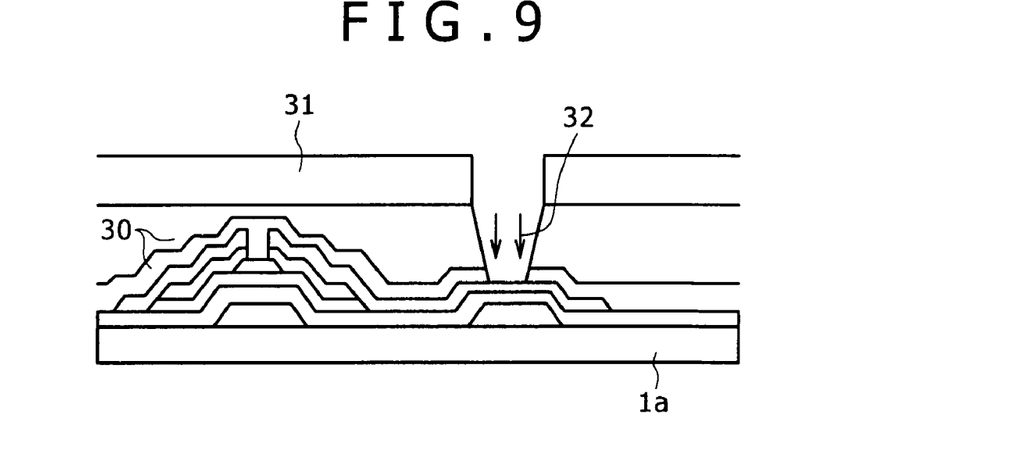
[FIG. 9] is an explanatory drawing showing an example of the step-by-step manufacturing process of the TFT substrate shown in the above FIG. 2.

Then, as shown in FIG. 9, a silicon nitride film produced in a thickness of 300 nm by the plasma CVD system is to form the passivation film 30. This film making is performed at a temperature of 250° C. Then, patterning and dry etching of the passivation film 30 are to follow to form the contact hole 32. This time, however, etching is continued even after the etching of the passivation film 30 is completed, that is, over-etching by 50% converted to time.

Figure 10:
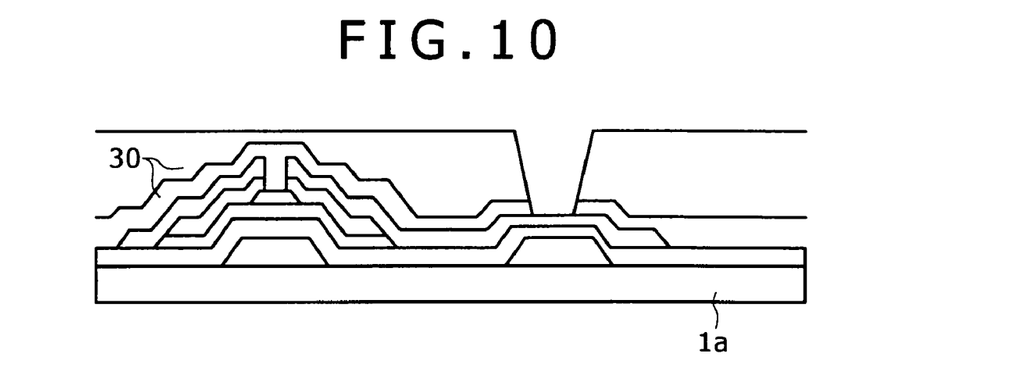
[FIG. 10] is an explanatory drawing showing an example of the step-by-step manufacturing process of the TFT substrate shown in the above FIG. 2.
Figure 11:
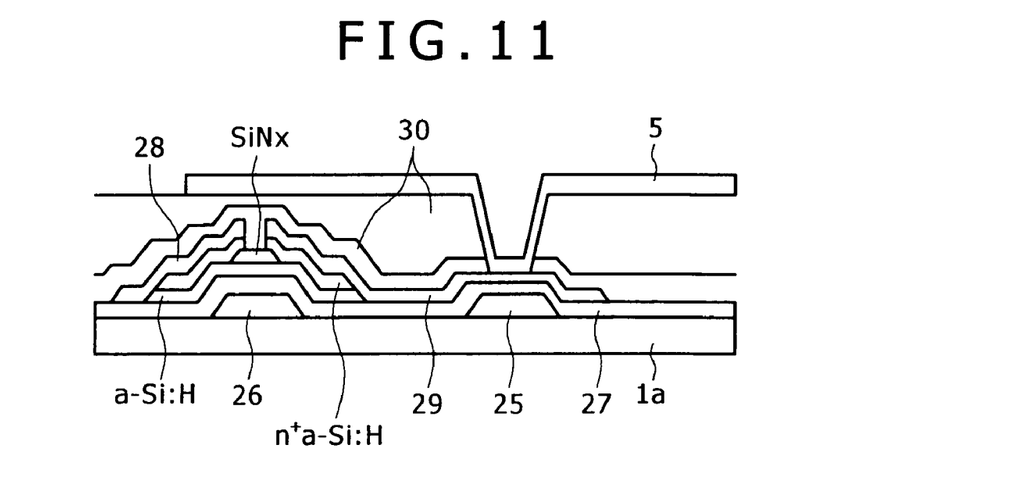
[FIG. 11] is an explanatory drawing showing an example of the step-by-step manufacturing process of the TFT substrate shown in the above FIG. 2.

Further as shown in FIG. 10, ashing by oxygen plasma is to be performed. After this, the photo resist 31 is to be removed with a release liquid, thereby creating a 40 nm-thick ITO film. Following that, the transparent electrode 5 as shown in FIG. 11 is formed by patterning and, at the same time, the TAB electrode are formed at the point where the gate wiring gets in contact with TAB, thus completing formation of the TFT substrate (TFT array substrate).

The TFT array substrate formed according to the above-mentioned manufacturing process has the transparent electrode (ITO film) 5 and the drain wiring 29 arranged to be in direct contact with each other. Furthermore, the gate wiring 26 and the source/drain wiring 28 & 29 are formed with the material common to all of them.

While examples are cited below to explain the present invention more concretely, it should be understood that the present invention is not limited to the specifics of the examples mentioned below. It should be also understood that other variations and modifications may be made within the extent of the content described above and below and such variations and modifications should be included within the technical scope of the present invention.

EXAMPLES

By using a composite sputtering target in which arranged are a sputtering target of pure Al (size: 101.6 mm dia.×5 mm thickness) and chips of the alloy elements listed in the table 1 below (chip size: 5 mm×5 mm×1 mm thickness) and a sputtering apparatus (HSM-552 manufactured by Shimadzu Corporation), and by the DC magnetron sputtering method (backing pressure: $0.27 \times 10^{-3}$ Pa or below; Ar gas pressure: 0.27 Pa; Ar gas flow volume: 30 sccm; sputter power: DC 200 W; distance between electrodes: 50.4 mm; substrate temperature: room temperature), formation of thin film (film thickness of 300 nm) of pure aluminum or aluminum alloys listed in the tables 1-4 was carried out on the glass substrate (Corning #1737; size: 50.8 mm dia.×0.7 mm thickness for evaluation of electrical resistivity and heat resistance; 101.6 mm dia.×0.7 mm thickness for evaluation of contact resistivity).

Alloy compositions of these films for evaluation were checked out by the ICP (Inductively Coupled Plasma) emission spectrometry or the ICP mass spectrometry, while evaluation of heat resistance as well as measurement of electrical resistivity and contact resistivity was also conducted by the following methods respectively.

[Heat Resistance]
Photolithography (process: coating of photoresist→prebaking→light exposure→PEB→photoresist image development→water washing→drying→post bake) using TSMR8900 photoresist of Tokyo Ohka Kogyo Co., Ltd., and NMD-W photoresist developing solution of the same manufacturer, and wet etching (process: wet etching→water washing→drying→photoresist removal→drying) using wet etchant, a mixed acid composed of phosphoric acid/nitric acid/water with the proportion of 75:5:20 by volume, were conducted, thereby forming stripe patterns with a line width of 10 μm and a line spacing of 10 μm on the pure aluminum film and each aluminum alloy film chips for evaluation.

Following the above process, vacuum heat treatment (degree of vacuum: $0.27 \times 10^{-3}$ Pa or below) was applied to both of the pure aluminum film and each aluminum alloy film at 350° C. or 250° C. for 30 minutes, and observation with a light microscope was made of hillocks, that is, defective swells occurring on the surface of wiring after heat treatment to find out the hillock density. When the hillock density was $1 \times 10^9$ pcs/sq.m or less, the heat resistance of the object film was evaluated "fair (○)," and particularly when the density was as small as $1 \times 10^8$ pcs/sq.m or less, the heat resistance was evaluated "superior (⊚)." When the hillock density was more than $1 \times 10^9$ pcs/sq.m, the heat resistance was evaluated "inferior (X)."

[Electrical Resistivity]
The pure aluminum film and each aluminum alloy film formed on the glass substrate (Corning #1737; size: 50.8 mm dia.×0.7 mm thickness) were processed by means of photolithography and wet etching into the patterns with a line width of 100 μm and a line length of 10 mm for evaluation of electrical resistance. In this case, the wet etchant used was a mixed-acid compound liquid consisting of phosphoric acid, nitric acid, and water at a ratio of 75:5:20 by volume. Then, while vacuum heat treatment (degree of vacuum: $0.27 \times 10^{-3}$ Pa or below) was applied to the films at 350° C. or 250° C. for 30 minutes in the vacuum heat treatment furnace, the electrical resistances of the films were measured before and after the above heat treatment by the DC four point probe method at the room temperature.

As to the result of the above measurement, when electrical resistivity was 5.0 μΩ·cm or below, the electrical resistance was evaluated "smaller (⊚)," and when the electrical resistivity was over 5.0 μΩ·cm and up to or below 7.0 μΩ·cm, the electrical resistance was evaluated "small (○)." Further when over 7.0 μΩ·cm, the electrical resistance was evaluated "large (X)."

[Contact Resistance]
A Kelvin pattern was formed by applying photolithography and wet etching to the pure aluminum film and each aluminum alloy film formed on the glass substrate (Corning #1737; size: 100 mm dia.×0.7 mm thickness). The wet etchant used in this connection was a mixed acid compound liquid consisting of phosphoric acid, nitric acid, and water at a ratio of 75:5:20 by volume. Then, a SiN film was produced by using a new type of CVD apparatus, and a contact hole (one hole of 10 μm square) was formed in that SiN film by the dry etching method with the IPC dry etcher. Succeedingly, the ITO film (200 nm thick) was formed by the RF magnetron sputtering method. The above ITO film was then led to creating the Kelvin pattern through the processing by means of photolithography and wet etching, in which process the wet etchant used was the ITO etching liquid (ITO-07N) manufactured by Kanto Chemical Co., Inc.

The contact resistivity was measured by the four point probe method. The contact resistivity per unit area was calculated from the known data on the area of the contact hole and the contact resistance, while the latter, namely the contact resistance, was measured from the amount of voltage drop at the contact portion in the interface between Al alloy and ITO.

When the above contact resistivity is below $1.0 \times 10^{-4}$ Ω·cm$^2$, the contact resistance was evaluated "less (⊚)," and when the above contact resistivity was above $1.0 \times 10^{-4}$ Ω·cm$^2$ and below $1.0 \times 10^{-3}$ Ω·cm$^2$, the contact resistance was evaluated "small (○)." Likewise, the above contact resistivity was above $1.0 \times 10^{-3}$ Ω·cm$^2$, the contact resistance was evaluated "large (x)."

All the results of the above measurements and evaluations are summarized in Tables 1 through 4.

TABLE 1

| Specimen No. | Composition of aluminum alloy film | Heat resistance (after treatment at 350 deg. C.) | Heat resistance (after treatment at 250 deg. C) | Electrical resistivity (after treatment at 350 deg. C.) | Electrical resistivity (after treatment at 250 deg. C.) | Contact Resistance with ITO | Overall Rating |
|---|---|---|---|---|---|---|---|
| 1 | Al | X | X | ⊚ | ⊚ | X | X |
| 2 | Al—2at%Ni | X | ○ | ⊚ | ⊚ | ⊚ | X |
| 3 | Al—0.3at%Ni—0.2at%Nd | ⊚ | ⊚ | ⊚ | ⊚ | ○ | ○ |
| 4 | Al—0.5at%Ni—0.2at%Nd | ⊚ | ⊚ | ⊚ | ⊚ | ⊚ | ⊚ |
| 5 | Al—1at%Ni—0.2at%Nd | ⊚ | ⊚ | ⊚ | ⊚ | ⊚ | ⊚ |
| 6 | Al—2at%Ni—0.2at%Nd | ⊚ | ⊚ | ⊚ | ⊚ | ⊚ | ⊚ |
| 7 | Al—4at%Ni—0.2at%Nd | ⊚ | ⊚ | ⊚ | ⊚ | ⊚ | ⊚ |
| 8 | Al—0.5at%Ni—0.6at%Nd | ⊚ | ⊚ | ⊚ | X | ⊚ | X |
| 9 | Al—1at%Ni—0.6at%Nd | ⊚ | ⊚ | ⊚ | X | ⊚ | X |
| 10 | Al—2at%Ni—0.6at%Nd | ⊚ | ⊚ | ⊚ | X | ⊚ | X |
| 11 | Al—4at%Ni—0.6at%Nd | ⊚ | ⊚ | ⊚ | X | ⊚ | X |
| 12 | Al—0.3at%Ni—0.35at%Nd | ⊚ | ⊚ | ⊚ | ○ | ○ | ○ |
| 13 | Al—0.5at%Ni—0.35at%Nd | ⊚ | ⊚ | ⊚ | ○ | ⊚ | ○ |
| 14 | Al—1at%Ni—0.35at%La | ⊚ | ⊚ | ⊚ | ⊚ | ⊚ | ⊚ |
| 15 | Al—2at%Ni—0.35at%La | ⊚ | ⊚ | ⊚ | ⊚ | ⊚ | ⊚ |
| 16 | Al—4at%Ni—0.35at%La | ⊚ | ⊚ | ⊚ | ○ | ⊚ | ○ |
| 17 | Al—0.5at%Ni—0.6at%La | ⊚ | ⊚ | ⊚ | ○ | ⊚ | ○ |
| 18 | Al—1at%Ni—0.6at%La | ⊚ | ⊚ | ⊚ | ○ | ⊚ | ○ |
| 19 | Al—2at%Ni—0.6at%La | ⊚ | ⊚ | ⊚ | ○ | ⊚ | ○ |
| 20 | Al—4at%Ni—0.6at%La | ⊚ | ⊚ | ⊚ | X | ⊚ | X |
| 21 | Al—2at%Ag | X | X | ⊚ | ⊚ | ⊚ | X |

TABLE 1-continued

| Specimen No. | Composition of aluminum alloy film | Heat resistance (after treatment at 350 deg. C.) | Heat resistance (after treatment at 250 deg. C) | Electrical resistivity (after treatment at 350 deg. C.) | Electrical resistivity (after treatment at 250 deg. C.) | Contact Resistance with ITO | Overall Rating |
|---|---|---|---|---|---|---|---|
| 22 | Al—0.5at%Ag—0.2at%Nd | ⊚ | ⊚ | ⊚ | ⊚ | ⊚ | ⊚ |
| 23 | Al—2at%Ag—0.2at%Nd | ⊚ | ⊚ | ⊚ | ⊚ | ⊚ | ⊚ |
| 24 | Al—2at%Ag—0.35at%La | ⊚ | ⊚ | ⊚ | ⊚ | ⊚ | ⊚ |
| 25 | Al—2at%Zn | X | X | ⊚ | ⊚ | ⊚ | X |
| 26 | Al—0.5at%Zn—0.2at%Nd | ⊚ | ⊚ | ⊚ | ⊚ | ⊚ | ⊚ |
| 27 | Al—2at%Zn—0.2at%Nd | ⊚ | ⊚ | ⊚ | ⊚ | ⊚ | ⊚ |
| 28 | Al—2at%Zn—0.35at%La | ⊚ | ⊚ | ⊚ | ⊚ | ⊚ | ⊚ |
| 29 | Al—2at%Ge | X | ○ | ⊚ | ⊚ | ⊚ | X |
| 30 | Al—0.5at%Ge—0.2at%Nd | ⊚ | ⊚ | ⊚ | ⊚ | ⊚ | ⊚ |
| 31 | Al—2at%Ge—0.2at%Nd | ⊚ | ⊚ | ⊚ | ⊚ | ⊚ | ⊚ |
| 32 | Al—2at%Ge—0.35at%La | ⊚ | ⊚ | ⊚ | ⊚ | ⊚ | ⊚ |
| 33 | Al—2at%Cu | X | X | ⊚ | ⊚ | ⊚ | X |
| 34 | Al—0.5at%Cu—0.2at%Nd | ⊚ | ⊚ | ⊚ | ⊚ | ⊚ | ⊚ |
| 35 | Al—2at%Cu—0.2at%Nd | ⊚ | ⊚ | ⊚ | ⊚ | ⊚ | ⊚ |
| 36 | Al—2at%Cu—0.35at%La | ⊚ | ⊚ | ⊚ | ⊚ | ⊚ | ⊚ |

TABLE 2

| Specimen No. | Composition of aluminum alloy film | Heat resistance (after treatment at 350 deg. C.) | Heat resistance (after treatment at 250 deg. C.) | Electrical resistivity (after treatment at 350 deg. C.) | Electrical resistivity (after treatment at 250 deg. C.) | Contact Resistance with ITO | Overall Rating |
|---|---|---|---|---|---|---|---|
| 37 | Al—0.5at%Ni—0.2at%Y | ⊚ | ⊚ | ⊚ | ⊚ | ⊚ | ⊚ |
| 38 | Al—1at%Ni—0.2at%Y | ⊚ | ⊚ | ⊚ | ⊚ | ⊚ | ⊚ |
| 39 | Al—2at%Ni—0.2at%Y | ⊚ | ⊚ | ⊚ | ⊚ | ⊚ | ⊚ |
| 40 | Al—4at%Ni—0.2at%Y | ⊚ | ⊚ | ⊚ | ○ | ⊚ | ○ |
| 41 | Al—1at%Ni—0.6at%Y | ⊚ | ⊚ | ⊚ | X | ⊚ | X |
| 42 | Al—2at%Ni—0.6at%Y | ⊚ | ⊚ | ⊚ | X | ⊚ | X |
| 43 | Al—4at%Ni—0.6at%Y | ⊚ | ⊚ | ⊚ | X | ⊚ | X |
| 44 | Al—0.5at%Ag—0.2at%Y | ⊚ | ⊚ | ⊚ | ⊚ | ⊚ | ⊚ |
| 45 | Al—0.5at%Ge—0.2at%Y | ⊚ | ⊚ | ⊚ | ⊚ | ⊚ | ⊚ |
| 46 | Al—0.5at%Zn—0.2at%Y | ⊚ | ⊚ | ⊚ | ⊚ | ⊚ | ⊚ |
| 47 | Al—0.5at%Cu—0.2at%Y | ⊚ | ⊚ | ⊚ | ⊚ | ⊚ | ⊚ |
| 48 | Al—1at%Ni—0.2at%Fe | ⊚ | ⊚ | ⊚ | ⊚ | ⊚ | ⊚ |
| 49 | Al—2at%Ni—0.2at%Fe | ⊚ | ⊚ | ⊚ | ⊚ | ⊚ | ⊚ |
| 50 | Al—4at%Ni—0.2at%Fe | ⊚ | ⊚ | ⊚ | ○ | ⊚ | ○ |
| 51 | Al—1at%Ni—0.6at%Fe | ⊚ | ⊚ | ⊚ | X | ⊚ | X |
| 52 | Al—2at%Ni—0.6at%Fe | ⊚ | ⊚ | ⊚ | X | ⊚ | X |
| 53 | Al—4at%Ni—0.6at%Fe | ⊚ | ⊚ | ⊚ | X | ⊚ | X |
| 54 | Al—1at%Ni—0.2at%Co | ⊚ | ⊚ | ⊚ | ⊚ | ⊚ | ⊚ |
| 55 | Al—2at%Ni—0.2at%Co | ⊚ | ⊚ | ⊚ | ⊚ | ⊚ | ⊚ |
| 56 | Al—4at%Ni—0.2at%Co | ⊚ | ⊚ | ⊚ | ○ | ⊚ | ○ |
| 57 | Al—1at%Ni—0.6at%Co | ⊚ | ⊚ | ⊚ | X | ⊚ | X |
| 58 | Al—2at%Ni—0.6at%Co | ⊚ | ⊚ | ⊚ | X | ⊚ | X |
| 59 | Al—4at%Ni—0.6at%Co | ⊚ | ⊚ | ⊚ | X | ⊚ | X |
| 60 | Al—0.5at%Ni—0.5at%Mg | ⊚ | ⊚ | ⊚ | ⊚ | ⊚ | ⊚ |
| 61 | Al—1at%Ni—0.5at%Mg | ⊚ | ⊚ | ⊚ | ⊚ | ⊚ | ⊚ |
| 62 | Al—2at%Ni—0.5at%Mg | ⊚ | ⊚ | ⊚ | ⊚ | ⊚ | ⊚ |
| 63 | Al—4at%Ni—0.5at%Mg | ⊚ | ⊚ | ⊚ | ○ | ⊚ | ○ |
| 64 | Al—1at%Ni—1.2at%Mg | ⊚ | ⊚ | ⊚ | ⊚ | ⊚ | ⊚ |
| 65 | Al—2at%Ni—1.2at%Mg | ⊚ | ⊚ | ⊚ | ⊚ | ⊚ | ⊚ |
| 66 | Al—4at%Ni—1.2at%Mg | ⊚ | ⊚ | ⊚ | X | ⊚ | X |
| 67 | Al—0.5at%Ag—1.2at%Mg | ⊚ | ⊚ | ⊚ | ⊚ | ⊚ | ⊚ |
| 68 | Al—0.5at%Ge—1.2at%Mg | ⊚ | ⊚ | ⊚ | ⊚ | ⊚ | ⊚ |
| 69 | Al—0.5at%Zn—1.2at%Mg | ⊚ | ⊚ | ⊚ | ⊚ | ⊚ | ⊚ |

TABLE 3

| Specimen No. | Composition of aluminum alloy film | Heat resistance (after treatment at 350 deg. C.) | Heat resistance (after treatment at 250 deg. C.) | Electrical resistivity (after treatment at 350 deg. C.) | Electrical resistivity (after treatment at 250 deg. C.) | Contact Resistance with ITO | Overall Rating |
|---|---|---|---|---|---|---|---|
| 70 | Al—0.5at%Cu—1.2at%Mg | ⊚ | ⊚ | ⊚ | ⊚ | ⊚ | ⊚ |
| 71 | Al—0.5at%Ni—0.2at%Gd | ⊚ | ⊚ | ⊚ | ⊚ | ⊚ | ⊚ |

TABLE 3-continued

| Specimen No. | Composition of aluminum alloy film | Heat resistance (after treatment at 350 deg. C.) | Heat resistance (after treatment at 250 deg. C.) | Electrical resistivity (after treatment at 350 deg. C.) | Electrical resistivity (after treatment at 250 deg. C.) | Contact Resistance with ITO | Overall Rating |
|---|---|---|---|---|---|---|---|
| 72 | Al—1at%Ni—0.2at%Gd | ◎ | ◎ | ◎ | ◎ | ◎ | ◎ |
| 73 | Al—2at%Ni—0.2at%Gd | ◎ | ◎ | ◎ | ◎ | ◎ | ◎ |
| 74 | Al—4at%Ni—0.2at%Gd | ◎ | ◎ | ◎ | ◎ | ◎ | ◎ |
| 75 | Al—1at%Ni—0.6at%Gd | ◎ | ◎ | ◎ | ◎ | ◎ | ◎ |
| 76 | Al—2at%Ni—0.6at%Gd | ◎ | ◎ | ◎ | ◎ | ◎ | ◎ |
| 77 | Al—4at%Ni—0.6at%Gd | ◎ | ◎ | ◎ | X | ◎ | X |
| 78 | Al—0.5at%Ag—0.2at%Gd | ◎ | ◎ | ◎ | ◎ | ◎ | ◎ |
| 79 | Al—0.5at%Ge—0.2at%Gd | ◎ | ◎ | ◎ | ◎ | ◎ | ◎ |
| 80 | Al—0.5at%Zn—0.2at%Gd | ◎ | ◎ | ◎ | ◎ | ◎ | ◎ |
| 81 | Al—0.5at%Cu—0.2at%Gd | ◎ | ◎ | ◎ | ◎ | ◎ | ◎ |
| 82 | Al—0.5at%Ni—0.2at%Tb | ◎ | ◎ | ◎ | ◎ | ◎ | ◎ |
| 83 | Al—1at%Ni—0.2at%Tb | ◎ | ◎ | ◎ | ◎ | ◎ | ◎ |
| 84 | Al—2at%Ni—0.2at%Tb | ◎ | ◎ | ◎ | ◎ | ◎ | ◎ |
| 85 | Al—4at%Ni—0.2at%Tb | ◎ | ◎ | ◎ | ◎ | ◎ | ◎ |
| 86 | Al—1at%Ni—0.6at%Tb | ◎ | ◎ | ◎ | ◎ | ◎ | ◎ |
| 87 | Al—2at%Ni—0.6at%Tb | ◎ | ◎ | ◎ | ◎ | ◎ | ◎ |
| 88 | Al—4at%Ni—0.6at%Tb | ◎ | ◎ | ◎ | X | ◎ | X |
| 89 | Al—0.5at%Ni—0.2at%Dy | ◎ | ◎ | ◎ | ◎ | ◎ | ◎ |
| 90 | Al—1at%Ni—0.2at%Dy | ◎ | ◎ | ◎ | ◎ | ◎ | ◎ |
| 91 | Al—2at%Ni—0.2at%Dy | ◎ | ◎ | ◎ | ◎ | ◎ | ◎ |
| 92 | Al—4at%Ni—0.2at%Dy | ◎ | ◎ | ◎ | ◎ | ◎ | ◎ |
| 93 | Al—1at%Ni—0.6at%Dy | ◎ | ◎ | ◎ | ◎ | ◎ | ◎ |
| 94 | Al—2at%Ni—0.6at%Dy | ◎ | ◎ | ◎ | ◎ | ◎ | ◎ |
| 95 | Al—4at%Ni—0.6at%Dy | ◎ | ◎ | ◎ | X | ◎ | X |
| 96 | Al—0.5at%Ni—0.2at%Mn | ◎ | ◎ | ◎ | ◎ | ◎ | ◎ |
| 97 | Al—1at%Ni—0.2at%Mn | ◎ | ◎ | ◎ | ◎ | ◎ | ◎ |
| 98 | Al—2at%Ni—0.2at%Mn | ◎ | ◎ | ◎ | ◎ | ◎ | ◎ |
| 99 | Al—4at%Ni—0.2at%Mn | ◎ | ◎ | ◎ | ◎ | ◎ | ◎ |
| 100 | Al—0.5at%Ni—0.2at%V | ◎ | ◎ | ◎ | ◎ | ◎ | ◎ |
| 101 | Al—1at%Ni—0.2at%V | ◎ | ◎ | ◎ | ◎ | ◎ | ◎ |
| 102 | Al—2at%Ni—0.2at%V | ◎ | ◎ | ◎ | ◎ | ◎ | ◎ |
| 103 | Al—4at%Ni—0.2at%V | ◎ | ◎ | ◎ | X | ◎ | X |

TABLE 4

| Specimen No. | Composition of aluminum alloy film | Heat resistance (after treatment at 350 deg. C.) | Heat resistance (after treatment at 250 deg. C.) | Electrical resistivity (after treatment at 350 deg. C) | Electrical resistivity (after treatment at 250 deg. C.) | Contact Resistance with ITO | Overall Rating |
|---|---|---|---|---|---|---|---|
| 104 | Al—0.5at%Ni—0.2at%Zr | ◎ | ◎ | ◎ | ◎ | ◎ | ◎ |
| 105 | Al—1at%Ni—0.2at%Zr | ◎ | ◎ | ◎ | ◎ | ◎ | ◎ |
| 106 | Al—2at%Ni—0.2at%Zr | ◎ | ◎ | ◎ | ◎ | ◎ | ◎ |
| 107 | Al—4at%Ni—0.2at%Zr | ◎ | ◎ | ◎ | X | ◎ | X |
| 108 | Al—0.5at%Ni—0.2at%Nb | ◎ | ◎ | ◎ | ◎ | ◎ | ◎ |
| 109 | Al—1at%Ni—0.2at%Nb | ◎ | ◎ | ◎ | ◎ | ◎ | ◎ |
| 110 | Al—2at%Ni—0.2at%Nb | ◎ | ◎ | ◎ | ◎ | ◎ | ◎ |
| 111 | Al—4at%Ni—0.2at%Nb | ◎ | ◎ | ◎ | X | ◎ | X |
| 112 | Al—0.5at%Ni—0.2at%Ta | ◎ | ◎ | ◎ | ◎ | ◎ | ◎ |
| 113 | Al—1at%Ni—0.2at%Ta | ◎ | ◎ | ◎ | ◎ | ◎ | ◎ |
| 114 | Al—2at%Ni—0.2at%Ta | ◎ | ◎ | ◎ | ◎ | ◎ | ◎ |
| 115 | Al—4at%Ni—0.2at%Ta | ◎ | ◎ | ◎ | X | ◎ | X |
| 116 | Al—0.5at%Ni—0.2at%Sm | ◎ | ◎ | ◎ | ◎ | ◎ | ◎ |
| 117 | Al—1at%Ni—0.2at%Sm | ◎ | ◎ | ◎ | ◎ | ◎ | ◎ |
| 118 | Al—2at%Ni—0.2at%Sm | ◎ | ◎ | ◎ | ◎ | ◎ | ◎ |
| 119 | Al—4at%Ni—0.2at%Sm | ◎ | ◎ | ◎ | ◎ | ◎ | ◎ |
| 120 | Al—1at%Ni—0.6at%Sm | ◎ | ◎ | ◎ | ◎ | ◎ | ◎ |
| 121 | Al—2at%Ni—0.6at%Sm | ◎ | ◎ | ◎ | ○ | ◎ | ○ |
| 122 | Al—4at%Ni—0.6at%Sm | ◎ | ◎ | ◎ | X | ◎ | X |

From the foregoing Tables 1 to 4, it is possible to have the following observations. That is, it has become clear that the aluminum alloy film satisfying the composition preferred in the present invention has a better heat resistance to high temperature and a lower electrical resistivity than the pure aluminum and further possesses at the same time a lower contact resistivity with ITO.

In particular, an aluminum alloy film that has turned out to be of three-component system, in which the base of aluminum is added as a second element with at least one element selected from the group consisting of "X" (X=Ni, Ag, Zn, Cu, Ge) and also added as a third element with one or more elements such as Nd, La etc., within the preferred range in this invention, has easily attained respective target levels in terms of excellent heat resistance to as high a temperature as 350° C. in heat treatment, low electrical resistivity at a heat treatment temperature of 250° C., and low contact resistivity with ITO. Therefore, it is clear that such a three-component system aluminum alloy film is most suitable as the wiring materials for the gate wiring and the source/drain wiring.

The invention claimed is:

1. A thin-film transistor substrate comprising:
   a first single-layer aluminum alloy film composing gate wiring; and
   a second single-layer aluminum alloy film composing source wiring and drain wiring, the second single-layer aluminum alloy film connected to at least one electrode, wherein
   the first single-layer aluminum alloy film composing said gate wiring is arranged on a substrate,
   the second single-layer aluminum alloy film composing said source wiring and said drain wiring is arranged orthogonally with respect to the arrangement of the first single-layer aluminum alloy film on the substrate,
   the first single-layer aluminum alloy film composing said gate wiring has the same composition as the second single-layer aluminum alloy film composing said source wiring and said drain wiring,
   the first and second single-layer aluminum alloy films comprise a first added component and a second added component, both added to the aluminum of the aluminum alloy films, and
   a weighted sum of a first percentage of the first added component and a second percentage of the second added component ranges from 0.1 to 6.

2. The thin-film transistor substrate according to claim 1, wherein
   the alloy content of said first and second single-layer aluminum alloy films includes:
      for the first added component, at least one component to be selected from a group consisting of X equal to Ni, Ag, Zn, Cu, or Ge at a percentage of 0.1 to 6 of said first and second single-layer aluminum alloy films,
      for the second added component, one or more components to be selected from a group consisting of $Y_1$, equal to Nd, Y, Fe, or Co at a percentage within the range calculated according to $0.1 \leq (CX+10\,CY_1) \leq 6$ with CX equal to the percentage of content of X in said first and second single-layer aluminum alloy films and $CY_1$, equal to the percentage of content of $Y_1$, in said first and second single-layer aluminum alloy films, and
      the remaining components in said first and second single-layer aluminum alloy films consisting of aluminum and unavoidable impurities.

3. The thin-film transistor substrate according to claim 1, wherein
   the alloy content of said first and second single-layer aluminum alloy films includes:
      for the first added component, at least one component to be selected from a group consisting of X equal to Ni, Ag, Zn, Cu, or Ge at a percentage of 0.1 to 6 of said single-layer aluminum alloy film,
      for the second added component, one or more components to be selected from a group consisting of $Y_2$ equal to Ti, V, Zr, Nb, Mo, Hf, Ta, or W at a percentage within the range calculated according to $0.1 \leq (CX+15\,CY_2) \leq 6$ with CX equal to the percentage of content of X in said first and second single-layer aluminum alloy films and $CY_2$ equal to the percentage of content of $Y_2$ in said first and second single-layer aluminum alloy films, and
      the remaining components in said first and second single-layer aluminum alloy films consisting of aluminum and unavoidable impurities.

4. The thin-film transistor substrate according to claim 1, wherein
   the alloy content of said first and second single-layer aluminum alloy films includes:
      for the first added component, at least one component to be selected from a group consisting of X equal to Ni, Ag, Zn, Cu, or Ge at a percentage of 0.1 to 6 of said first and second single-layer aluminum alloy films,
      for the second added component, one or more components to be selected from a group consisting of $Y_3$ equal to Cr, Mn, Ru, Rh, Pd, Ir, Pt, La, Gd, Tb, Dy, Sm, Eu, Ho, Er, Tm, Yb, or Lu at a percentage within the range calculated according to $0.1 \leq (CX+5\,CY_3) \leq 6$ with CX equal to the percentage of content of X in said first and second single-layer aluminum alloy films and $CY_3$ equal to the percentage of content of $Y_3$ in said first and second single-layer aluminum alloy films, and
      the remaining components in said first and second single-layer aluminum alloy films consisting of aluminum and unavoidable impurities.

5. The thin-film transistor substrate according to claim 1, wherein
   the alloy content of said first and second single-layer aluminum alloy films includes:
      for the first added component, at least one component to be selected from a group consisting of X equal to Ni, Ag, Zn, Cu, or Ge at a percentage of 0.1 to 6 of said first and second single-layer aluminum alloy films,
      for the second added component, one additional component Mg at a percentage within the range calculated according to $1 \leq (CX+2\,CMg) \leq 6$ with CX equal to the percentage of content X in said first and second single-layer aluminum alloy films and Mg equal to the percentage of content Mg in said first and second single-layer aluminum alloy films, and
      the remaining components in said first and second single-layer aluminum alloy films consisting of aluminum and unavoidable impurities.

6. The thin-film transistor substrate according to claim 2, wherein the alloy content of said first and second single-layer aluminum alloy films contains Ni at a percentage of 0.1 or more.

7. A display device provided with the thin-film transistor substrate according to claim 1.

* * * * *